(12) United States Patent
Zhang et al.

(10) Patent No.: US 9,741,613 B1
(45) Date of Patent: Aug. 22, 2017

(54) METHOD FOR PRODUCING SELF-ALIGNED LINE END VIAS AND RELATED DEVICE

(71) Applicant: GLOBALFOUNDRIES Inc., Grand Cayman (KY)

(72) Inventors: John H. Zhang, Altamont, NY (US); Carl J. Radens, LaGrangeville, NY (US); Lawrence A. Clevenger, Rhinebeck, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/175,308

(22) Filed: Jun. 7, 2016

(51) Int. Cl.
  *H01L 21/302* (2006.01)
  *H01L 21/461* (2006.01)
  *H01L 21/768* (2006.01)
  *H01L 23/522* (2006.01)
  *H01L 23/532* (2006.01)

(52) U.S. Cl.
  CPC .... *H01L 21/76897* (2013.01); *H01L 21/7684* (2013.01); *H01L 21/76802* (2013.01); *H01L 21/76843* (2013.01); *H01L 23/5226* (2013.01); *H01L 23/53238* (2013.01)

(58) Field of Classification Search
  CPC ......... H01L 21/76897; H01L 21/76802; H01L 21/76843

USPC ........................................................ 438/689
See application file for complete search history.

(56) References Cited

U.S. PATENT DOCUMENTS

| | | | | |
|---|---|---|---|---|
| 2014/0038412 A1* | 2/2014 | Hu | ..................... | H01L 21/76811 438/689 |
| 2014/0077305 A1* | 3/2014 | Pethe | ................. | H01L 21/76895 257/368 |
| 2015/0179513 A1* | 6/2015 | Myers | ............... | H01L 21/76879 257/774 |
| 2016/0204002 A1* | 7/2016 | Wallace | ............ | H01L 21/76897 257/773 |

* cited by examiner

*Primary Examiner* — David S Blum
(74) *Attorney, Agent, or Firm* — Ditthavong & Steiner, P.C.

(57) ABSTRACT

A method for producing self-aligned line end vias and the resulting device are provided. Embodiments include forming trenches in a dielectric layer; filling the trenches with a sacrificial layer; forming and etching a block mask over sacrificial layers to form a cut area over a portion of the trenches; forming spacers at sides of the cut area; removing the sacrificial layer from the portion of the trenches; forming a mask in the cut area and the portion of trenches, the mask selected from a HDP oxide, SiC or SiCNH; selectively etching the spacers; and selectively etching the sacrificial layer and the dielectric layer by RIE to form SAVs.

17 Claims, 15 Drawing Sheets

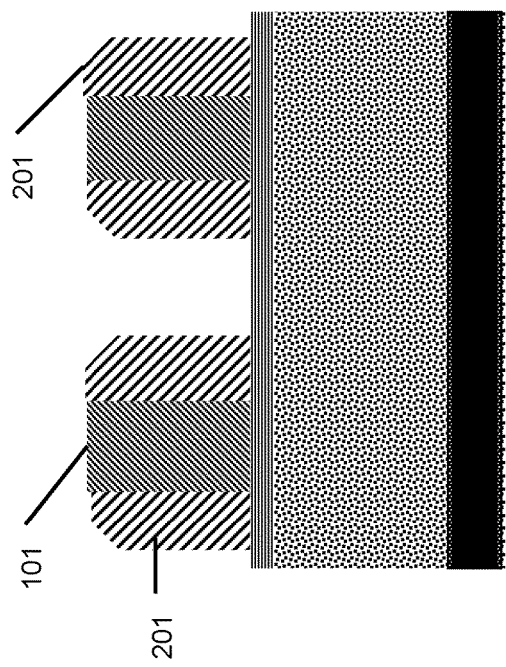
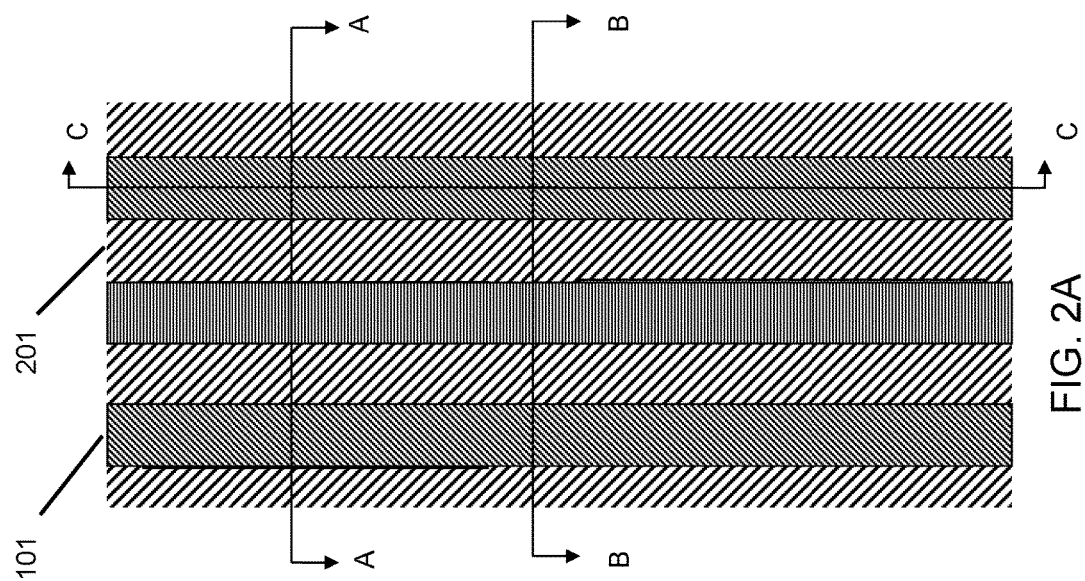
FIG. 2B
FIG. 2A

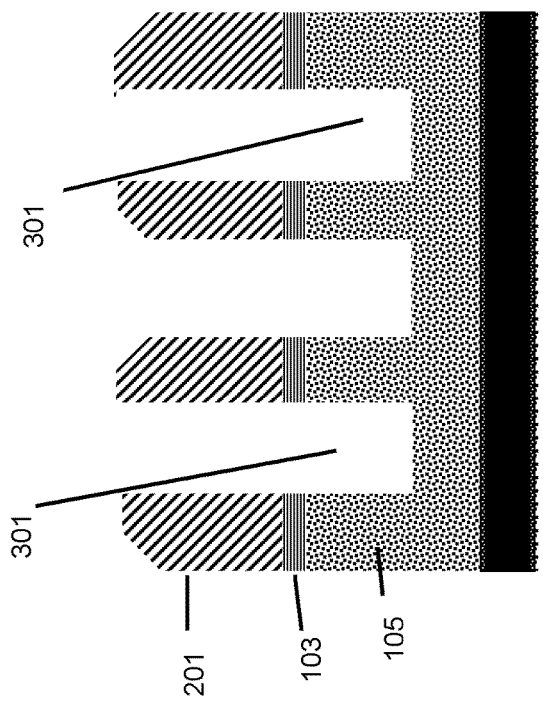
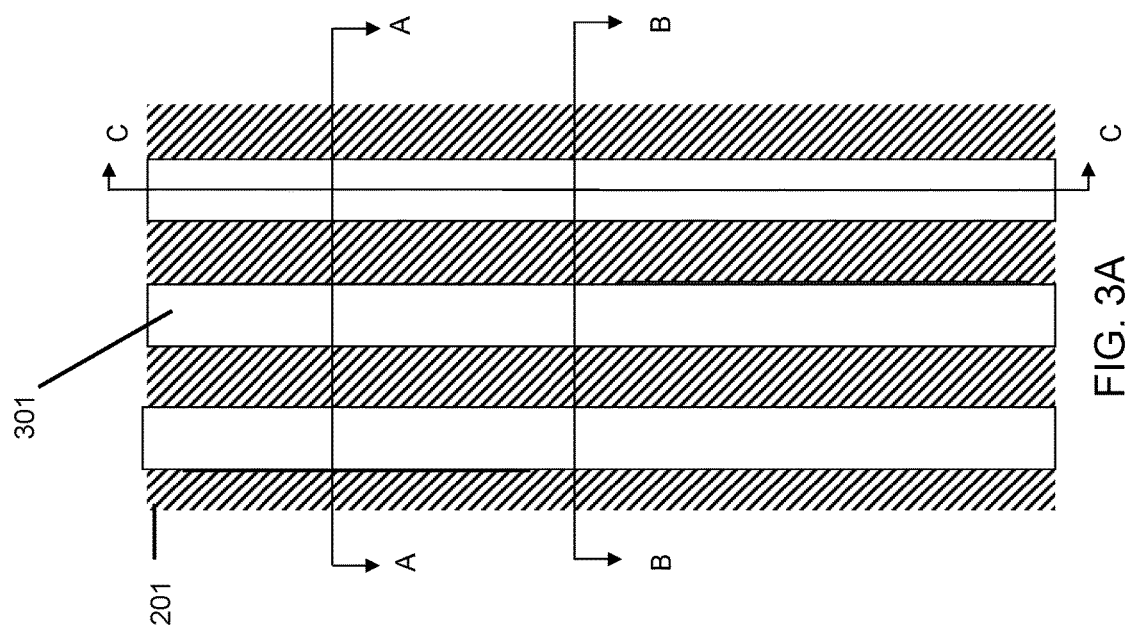
FIG. 3B
FIG. 3A

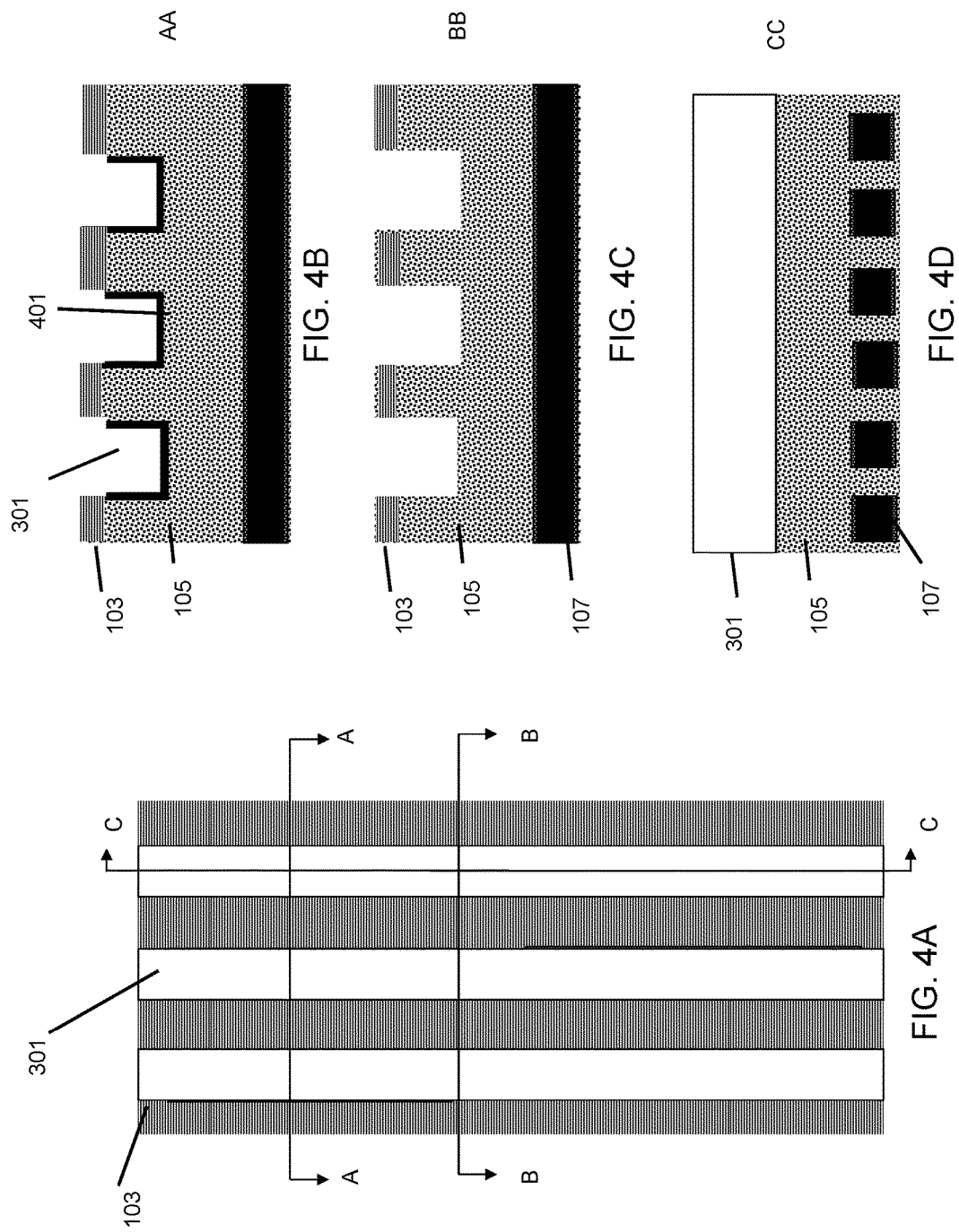

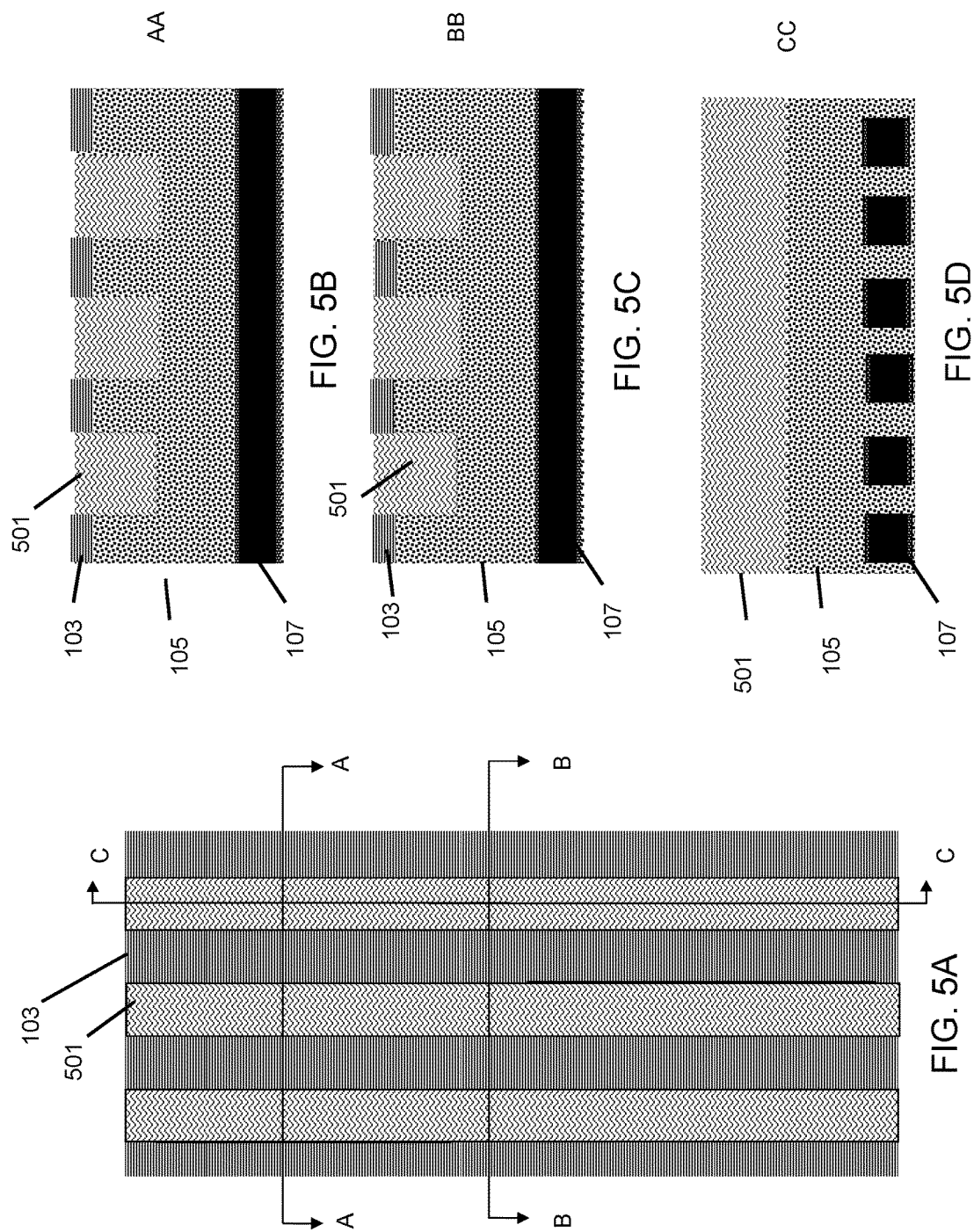

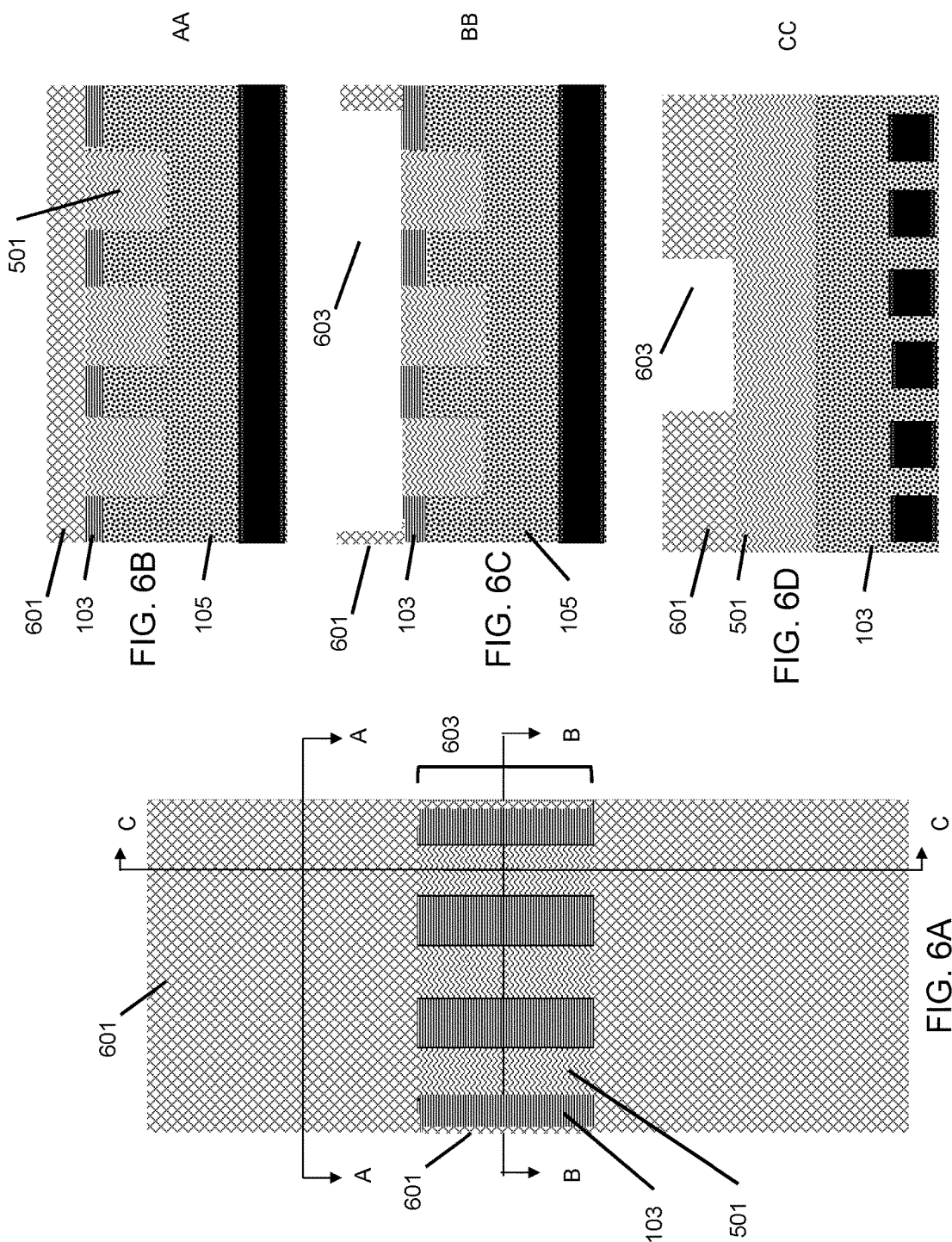

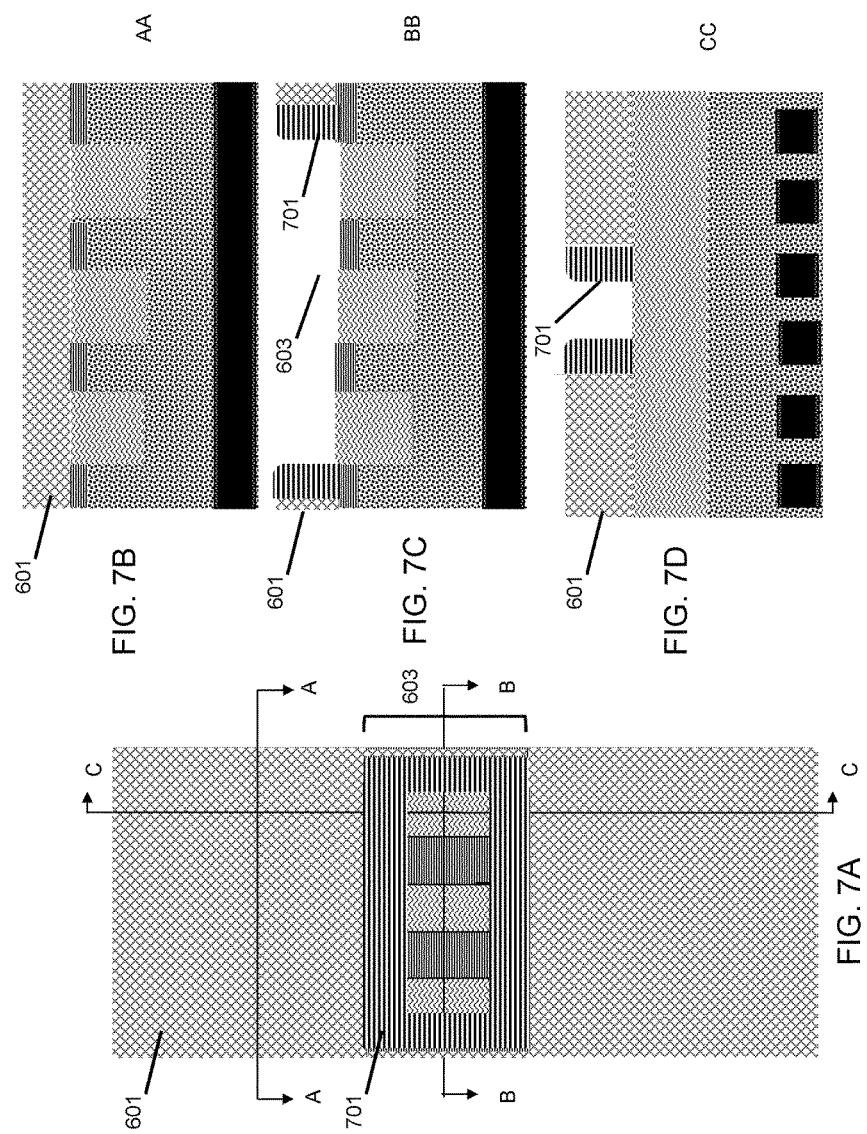

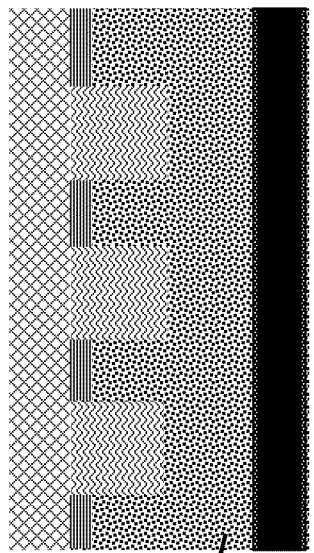
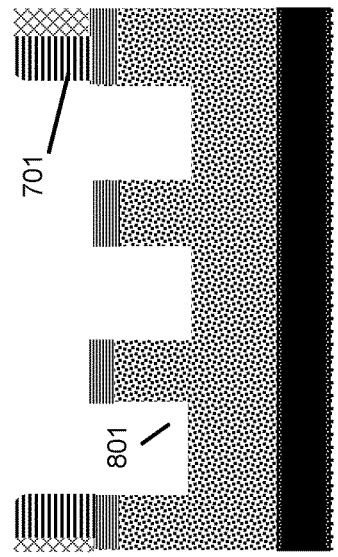
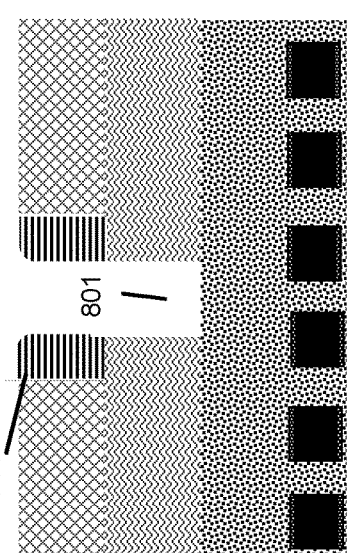
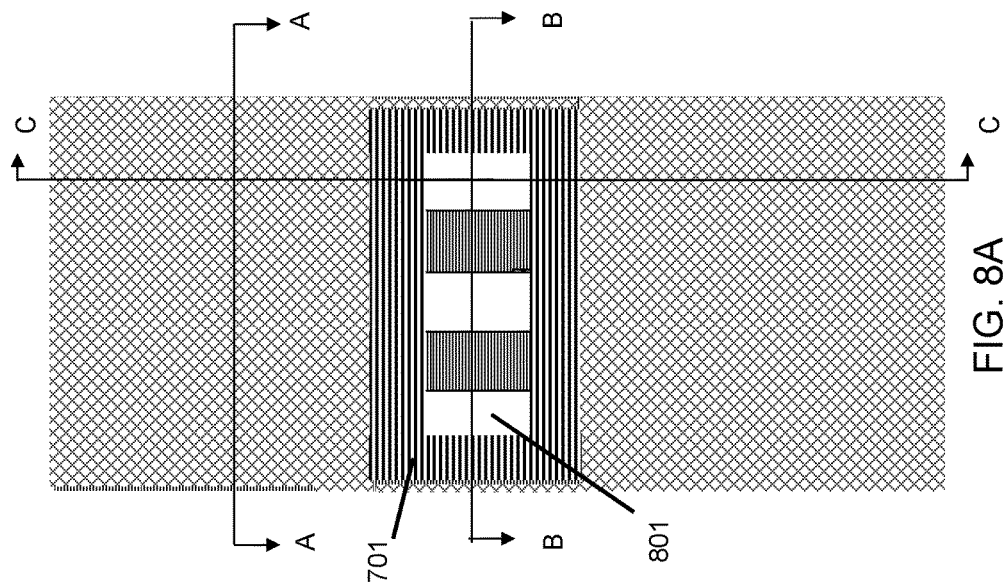

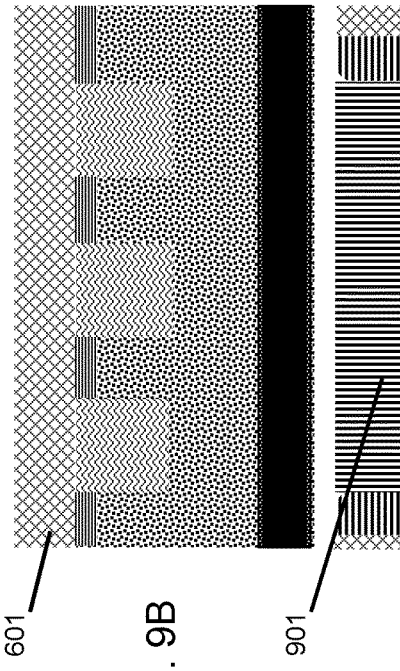
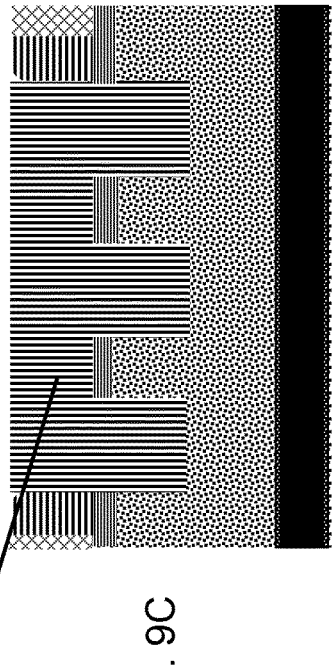
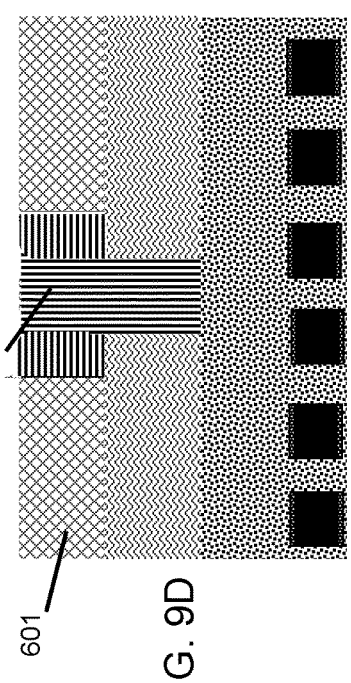
FIG. 9B
FIG. 9C
FIG. 9D
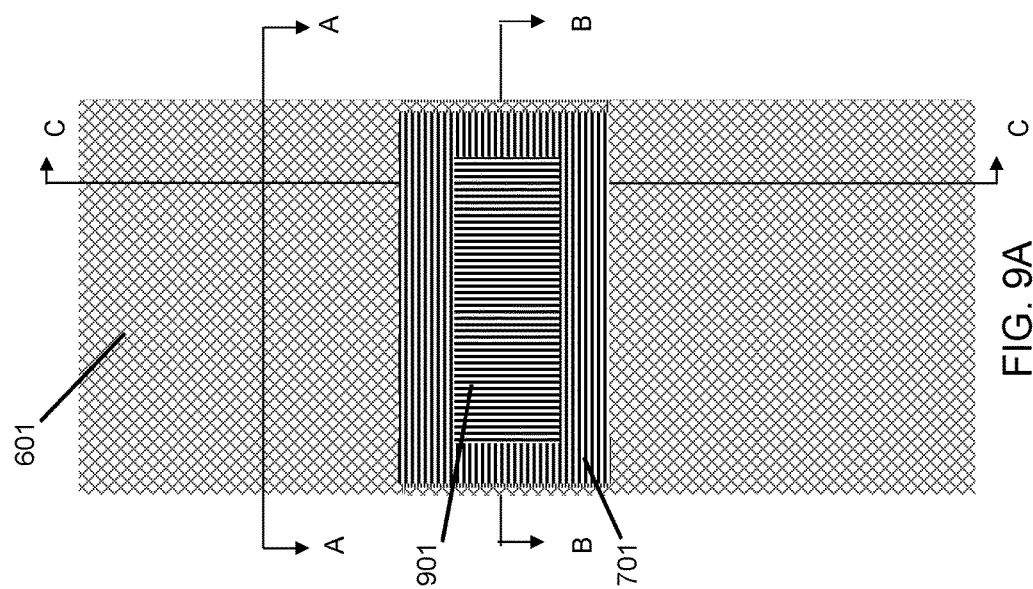
FIG. 9A

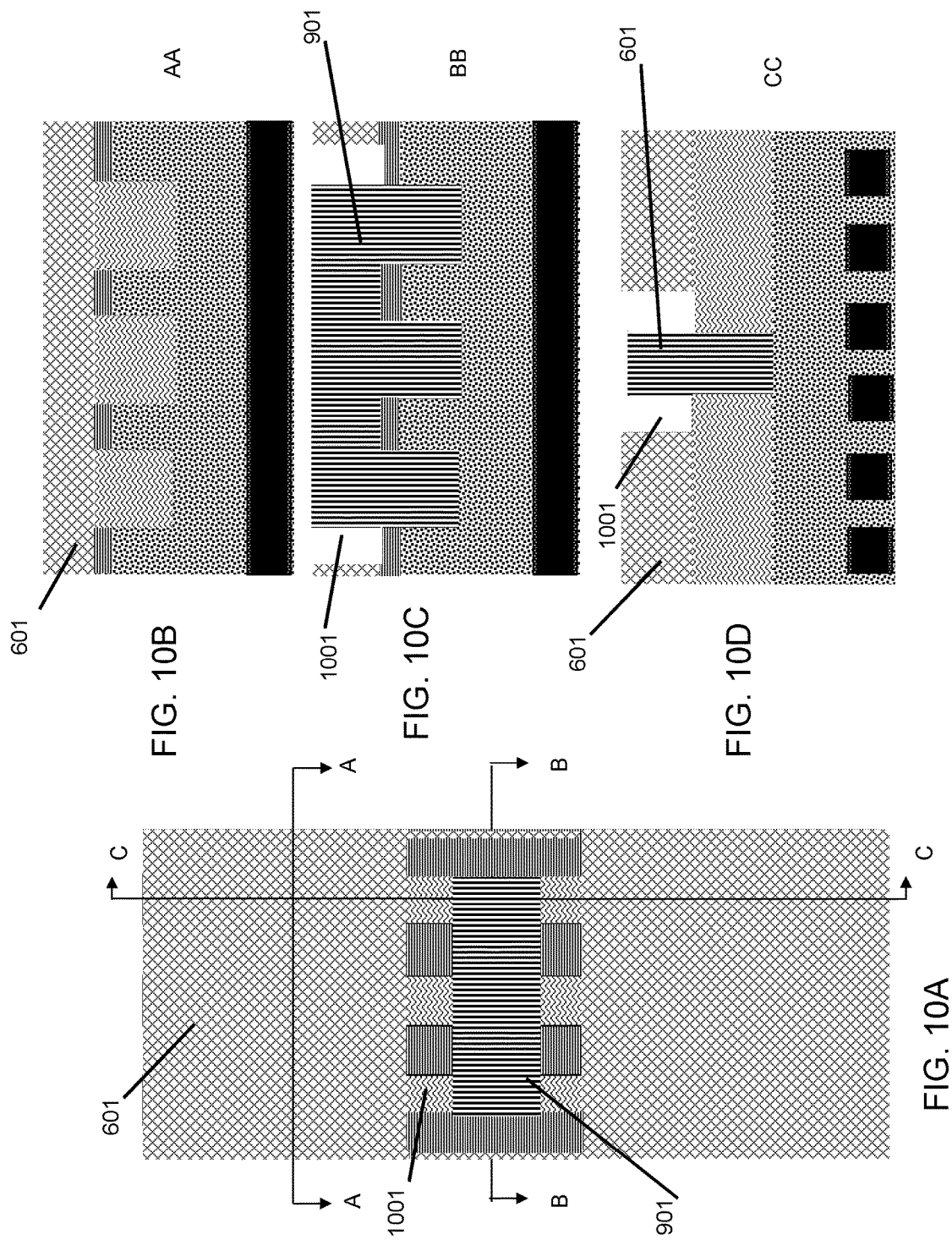

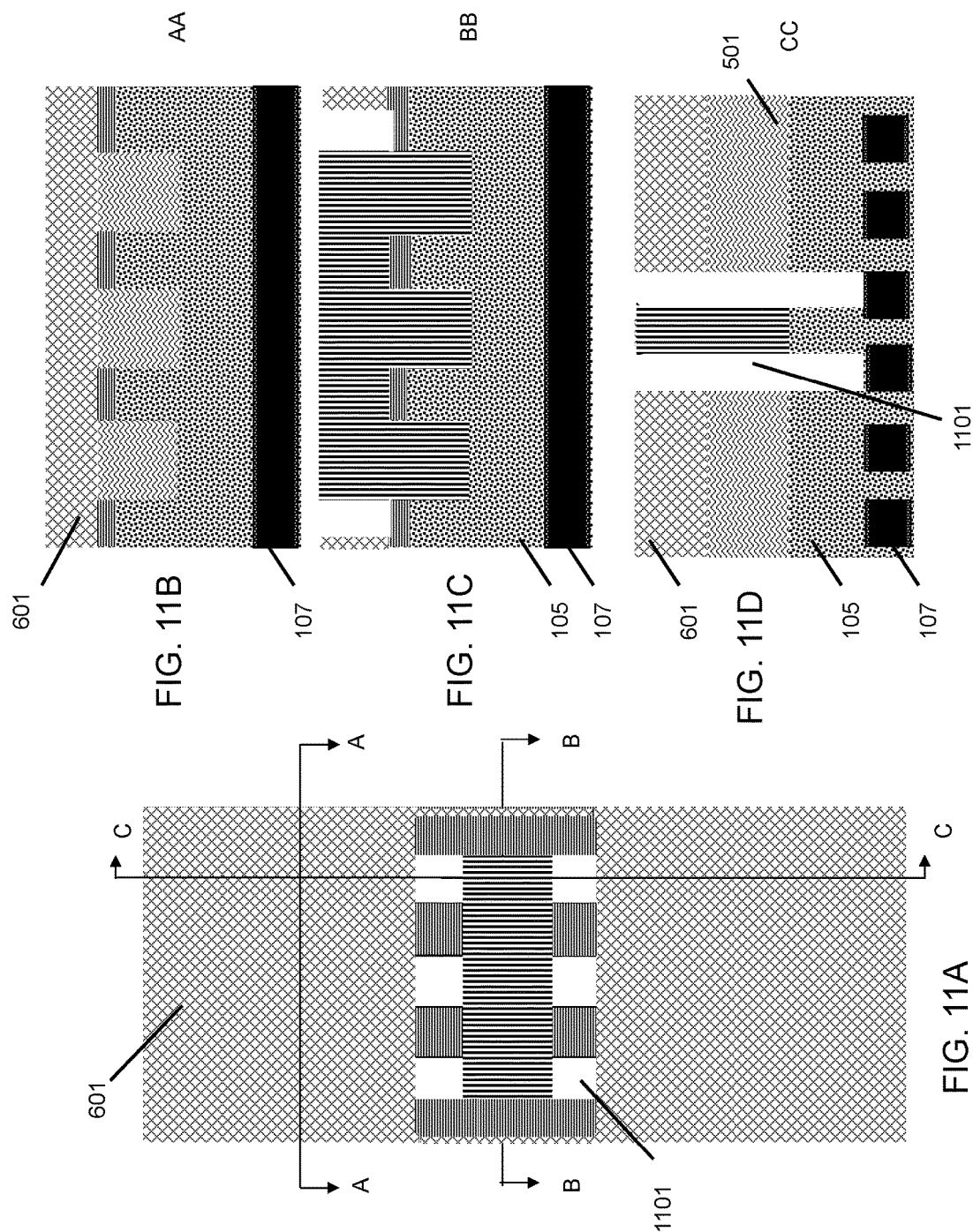

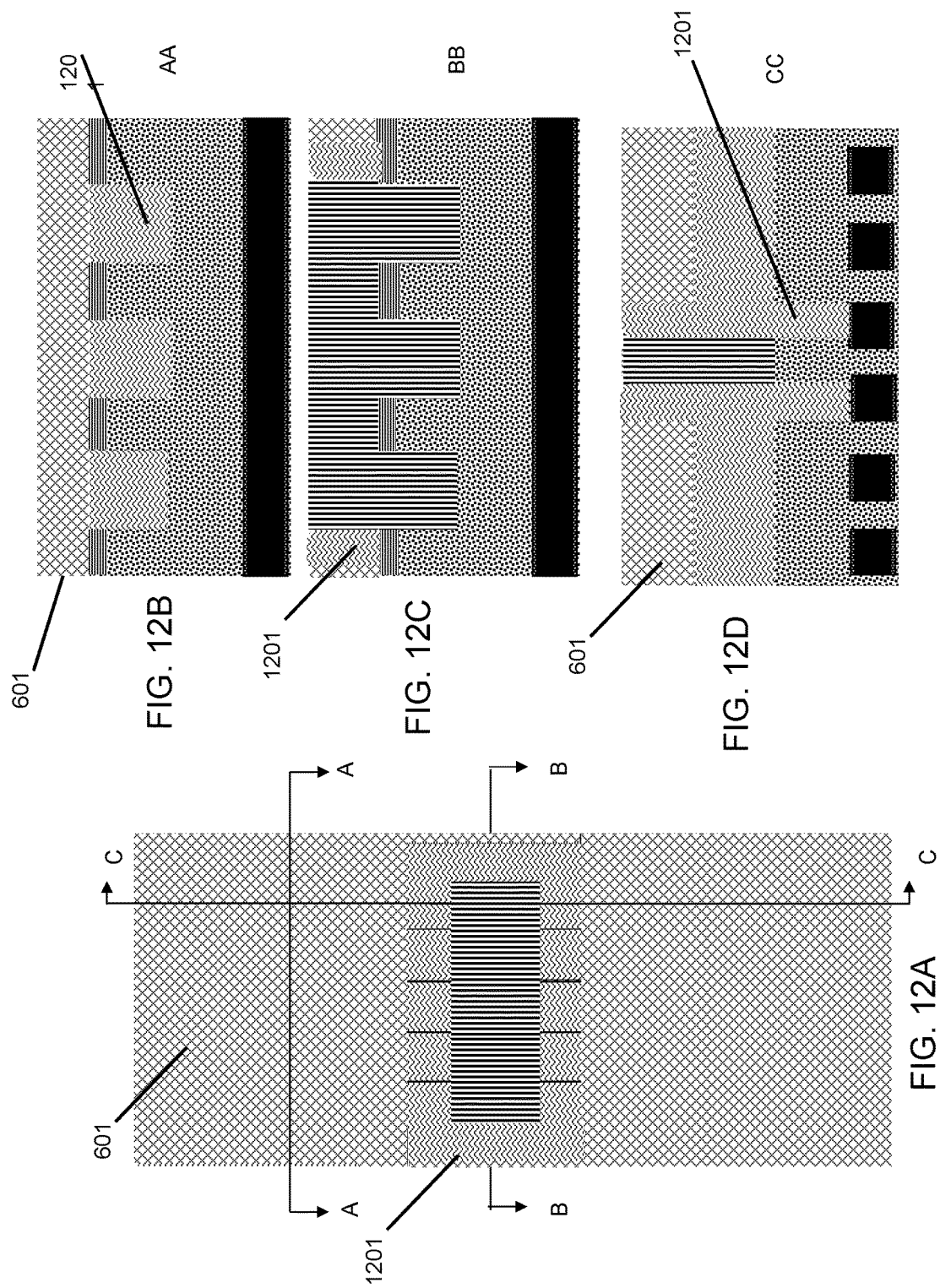

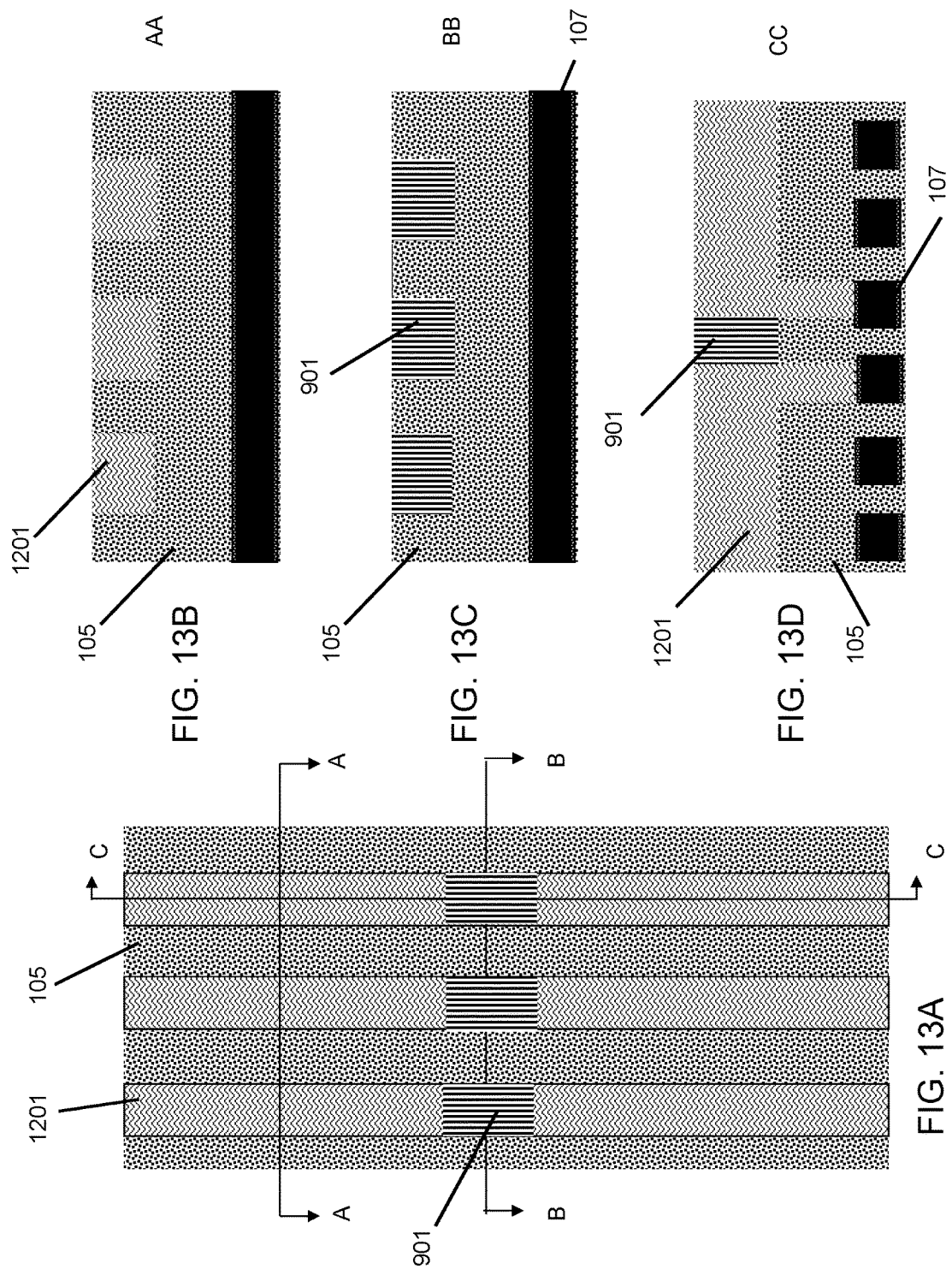

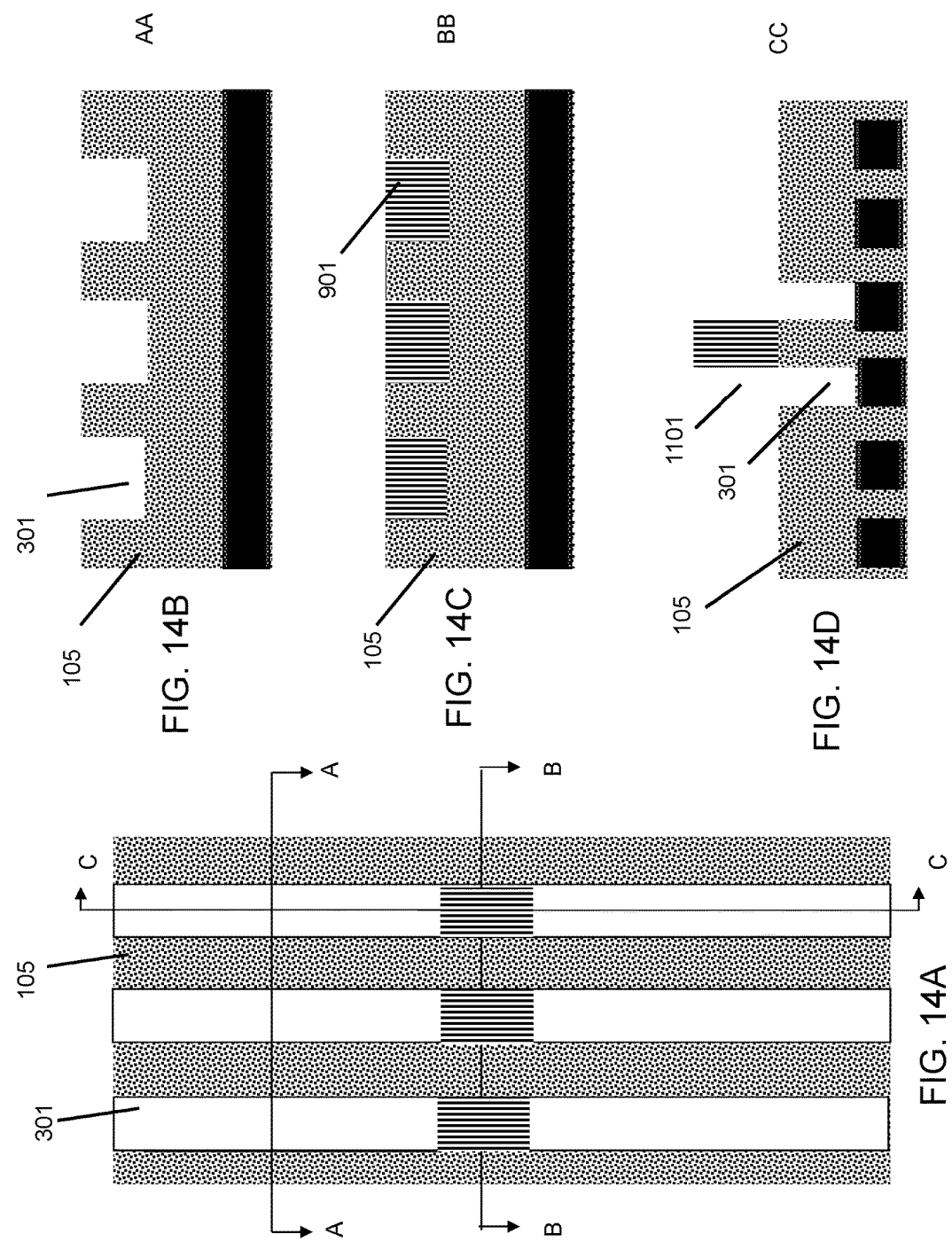

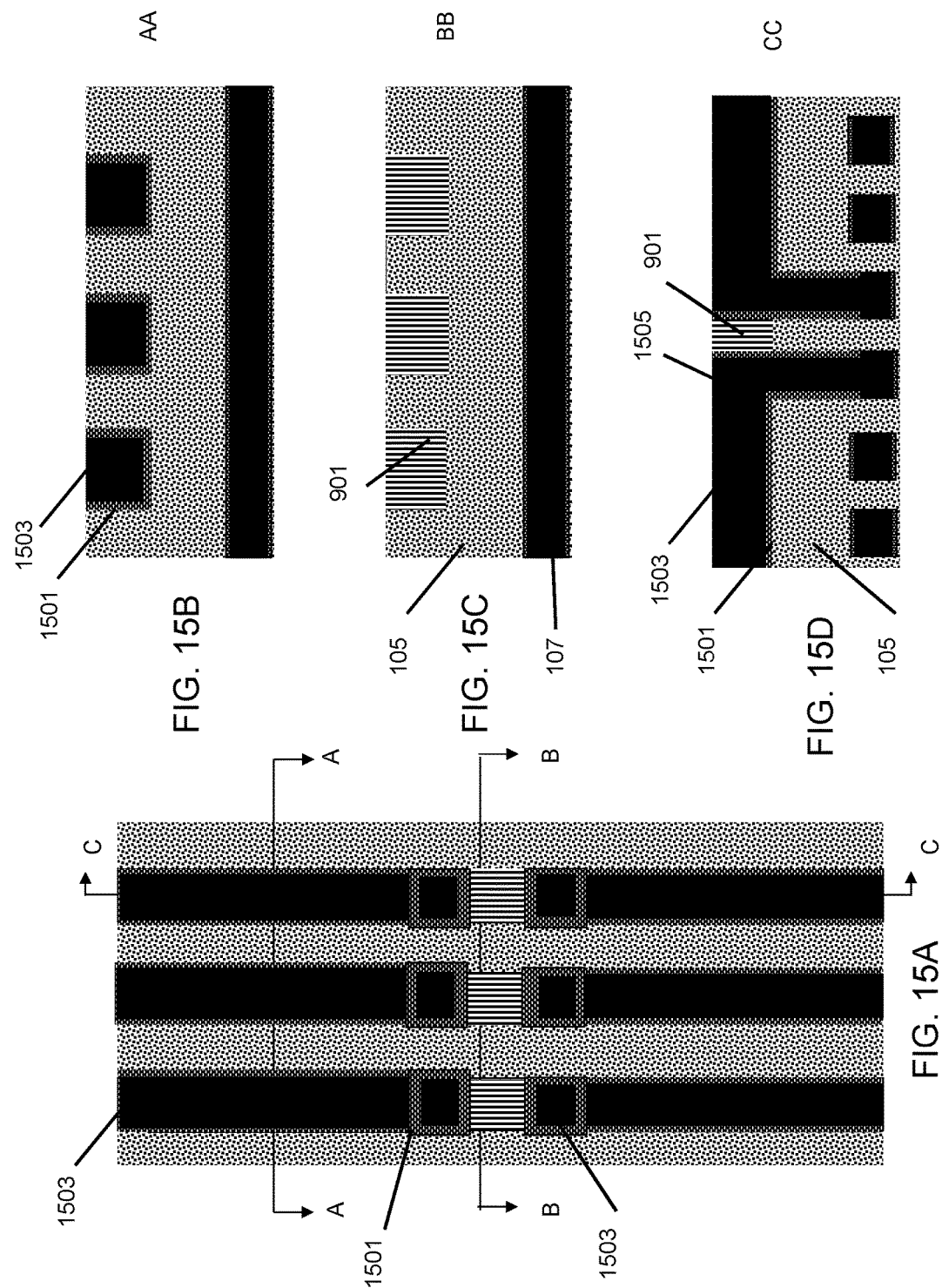

METHOD FOR PRODUCING SELF-ALIGNED LINE END VIAS AND RELATED DEVICE

TECHNICAL FIELD

The present disclosure relates to semiconductor devices having line end vias. In particular, the present disclosure relates to self-aligned line end vias for semiconductor devices in the 14 nanometer (nm) technology node and beyond.

BACKGROUND

As semiconductor devices continue to get smaller and technology nodes shrink into the lower nanometer range, device scaling needs to continue to provide both lower cost and improved performance. Tip to tip patterning of lines with minimum spacing is critical and extremely challenging. Electrical shorts and opens result with existing via patterning processes. Patterning is even more of a challenge when the via (e.g., self-aligned via (SAV)) is formed at the end of the lines.

A need therefore exists for methodology enabling the formation of line end vias without the risk of electrical shorts, and the resulting device.

SUMMARY

An aspect of the present disclosure is a method of forming line end vias with a line cut mask spacer using reactive ion etching (RIE). The present disclosure takes advantage of a cut mask spacer for self-aligned line end via formation.

Another aspect of the present disclosure is a device including line end vias formed with a line cut mask spacer using reactive ion etching (RIE)

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a hardmask layer over a dielectric layer; forming mandrels over the hardmask layer; forming first spacers on sides of the mandrels; forming trenches by removing the mandrels and etching through the hardmask layer down into the dielectric layer; removing the first spacers; filling the trenches with a sacrificial layer; forming and etching a block mask over the hardmask and sacrificial layers to form a cut area over a portion of the trenches; forming second spacers at sides of the cut area; removing the sacrificial layer from the portion of the trenches; forming a mask in the cut area and the portion of trenches, the mask selected from a high density plasma (HDP) oxide, silicon carbide (SiC) or silicon carbon nitride (SiCNH); selectively etching the second spacers; and selectively etching the sacrificial layer and the dielectric layer to form SAVs.

Aspects of the present disclosure include forming a nitride liner in the trenches after removing the first spacers. Other aspects include filling the SAVs with a sacrificial material, the sacrificial material including an ODL. Further aspects include planarizing the sacrificial material down to the dielectric layer to expose an upper surface of the mask in the portion of the trenches. Additional aspects include selectively removing the sacrificial layer from the trenches and SAVs. Yet further aspects include forming a metal liner in the trenches and SAVs; forming metal over the metal liner to fill the trenches and SAVs; and planarizing the metal liner and metal down to the upper surface of the mask and the dielectric layer. Another aspect includes forming the hardmask layer including titanium nitride (TiN) over the dielectric layer, wherein the dielectric layer includes an ultra low-k (ULK) dielectric. Another aspect includes forming the mandrels including an optical dispersive layer (ODL) over the hardmask layer. Other aspects include forming the first spacers including an oxide on the sides of the mandrels. Yet further aspects include forming the second spacers including silicon nitride (SiN) at the sides of the cut area. Additional aspects include selectively etching the sacrificial layer and the dielectric layer by RIE to form the SAVs.

Another aspect of the present disclosure is method including forming trenches in a dielectric layer; filling the trenches with a sacrificial layer; forming and etching a block mask over sacrificial layers to form a cut area over a portion of the trenches; forming spacers at sides of the cut area; removing the sacrificial layer from the portion of the trenches; forming a mask in the cut area and the portion of trenches, the mask selected from a HDP oxide, SiC or SiCNH; selectively etching the spacers; and selectively etching the sacrificial layer and the dielectric layer by RIE to form SAVs.

Aspects include filling the SAVs with a sacrificial material, the sacrificial material including an ODL. Other aspects include planarizing the sacrificial material down to the dielectric layer to expose an upper surface of the oxide mask in the portion of the trenches. Further aspects include selectively removing the sacrificial layer from the trenches and SAVs. Additional aspects include forming a metal liner in the trenches and SAVs; forming metal over the metal liner to fill the trenches and SAVs; and planarizing the metal liner and metal down to the upper surface of the mask and the dielectric layer. Another aspect includes forming the hardmask layer including TiN over the dielectric layer, wherein the dielectric layer includes an ULK dielectric; and forming the spacers including SiN at the sides of the cut area.

According to the present disclosure some technical effects may also be achieved in part by a device trench lines formed in a dielectric layer; each trench line including a pair of self aligned line end vias; and a HDP oxide, SiC or SiCNH formed between each pair of self aligned line end vias, wherein the trench lines and self aligned line end vias are filled with a metal liner and metal.

Aspects include the dielectric layer including a ULK dielectric; and the metal including copper. Further aspects include a bottom of the dielectric layer including metal contacts which contact the pairs of self aligned line end vias.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 15A (top views); FIGS. 1B through 15B (cross-sectional views along line AA); FIGS. 4C through 15C (cross-sectional views along line BB); and FIGS. 4D through 15D (cross-sectional views along line CC) schematically illustrate a patterning process flow, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of electrical shorts and opens during formation of vias at the end of lines. The problems are solved by advantageously using a cut mask spacer for self-aligned line end via formation.

Methodology in accordance with embodiments of the present disclosure include forming trenches in a dielectric layer; filling the trenches with a sacrificial layer; forming and etching a block mask over sacrificial layers to form a cut area over a portion of the trenches; forming spacers at sides of the cut area; removing the sacrificial layer from the portion of the trenches; forming a mask in the cut area and the portion of trenches, the mask selected from a HDP oxide, SiC or SiCNH; selectively etching the spacers; and selectively etching the sacrificial layer and the dielectric layer by RIE to form SAVs.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
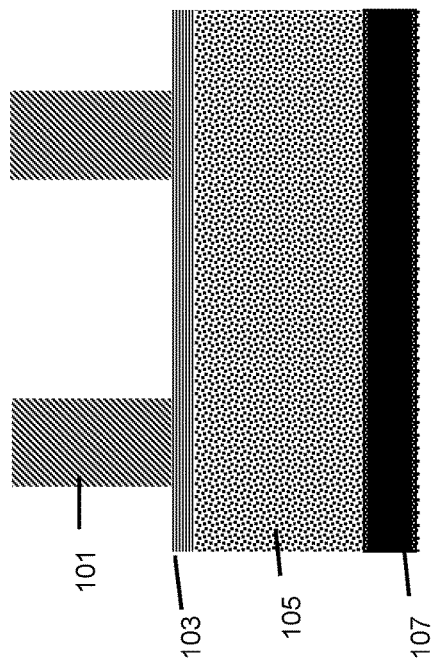
Figure 1A:
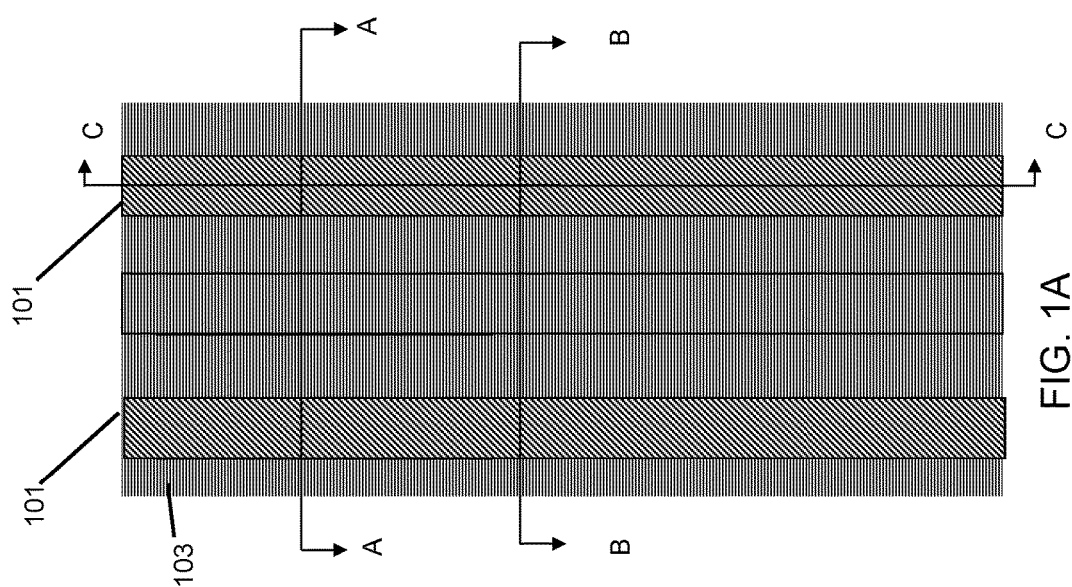

Adverting to FIGS. 1A and 1B, mandrels 101 are formed by RIE and disposed over a metal hardmask 103, such a TiN layer. The mandrels 101 are formed to a height of 60 to 100 nm over the metal hardmask 103, which has a thickness of 15 to 35 nm. The mandrels 101 are formed of an optical dispersive layer (ODL). The metal hardmask 103 is formed over a dielectric layer 105. The dielectric layer 105 is formed to a thickness of 80 to 120 nm and includes a ULK dielectric having a dielectric constant of 2.55. The dielectric layer 105 is formed over metal contacts 107.

As illustrated in FIGS. 2A and 2B, an oxide layer is deposited and etched to form spacers 201 on sides of the mandrels 101. In FIGS. 3A and 3B, a selective RIE is performed to remove the mandrels 101 and form trench lines 301. The trench lines 301 extend through the metal hardmask 103 and into a portion of the dielectric layer 105.

Trench lines 301 are also formed through the hardmask 103 and into the dielectric layer 105 between spacers associated with adjacent mandrels.

Adverting to FIGS. 4A, 4B, 4C and 4D, the spacer 201 is stripped to expose an upper surface of the metal hardmask 103. As illustrated in FIG. 4B, an optional SiN liner 401 can be added to protect the exposed surfaces of the dielectric layer 105. The SiN liner is only shown in FIG. 4B for illustrative convenience. As shown in FIGS. 5A, 5B, 5C and 5D, the trench lines 301 are filled with a sacrificial material 501, such as an ODL. The sacrificial material 501 is subjected to chemical mechanical polishing (CMP) to stop at an upper surface of the metal hardmask 103.

Adverting to FIGS. 6A, 6B, 6C and 6D, a block mask 601 is formed over the metal hardmask 103 and sacrificial material 501. The block mask 601 is then etched to form an open area 603 to expose a portion of the sacrificial material 501 and metal hardmask 103. The block mask is formed of a low temperature oxide (LTO) to a thickness of 10 to 30 nm. As shown in FIGS. 7A, 7B, 7C and 7D, a spacer 701 is formed along the sides of the open area 603. The spacer 701 is formed of SiN and polished to an upper surface of the block mask 601.

Adverting to FIGS. 8A, 8B, 8C and 8D, the sacrificial material 501 in the open area 601 is removed by etching to form openings 801 that extend down to an upper surface of the dielectric layer 105. Next, in FIGS. 9A, 9B, 9C and 9D, a mask 901 is formed in openings 801 and polished to stop on an upper surface of the block mask layer 601. The mask 901 is selected from a HDP oxide, SiC or SiCNH.

As shown in FIGS. 10A, 10B, 10C, and 10D, a selective etching step is performed to remove the SiN spacers 701. In FIGS. 11A, 11B, 11C and 11D, a selective RIE is performed through openings created by the removal of SiN spacers 201 to create self-aligned vias (SAVs) 1101. The SAVs 1101 extend down through the sacrificial material 501 and dielectric layer 105 to reach the metal contacts 107. The SAVs 1101 are self aligned line end vias.

In FIGS. 12A, 12B, 12C and 12D, the SAVs 1101 are filled with a sacrificial material 1201. As shown in FIGS. 13A, 13B, 13C, and 13D, a CMP step is performed to polish the sacrificial material 1201 down to the dielectric layer 105. An upper surface of the mask 901 is planar with an upper surface of the dielectric layer 105.

Adverting to FIGS. 14A, 14B, 14C and 14D, a selective etching step is performed to remove the sacrificial material 1201 from the trenches 301 and SAVs 1101. As shown in FIGS. 15A, 15B, 15C and 15D, the trenches 301 and SAVs 1101 are filled with a metal liner 1501 and a metal 1503. The metal liner 1501 can be formed of tantalum (Ta)/Ta nitride (TaN), and the metal 1503 can be formed of copper (Cu). The line end SAVs 1505 are formed on opposite sides of the mask 901.

The embodiments of the present disclosure can achieve several technical effects including the formation of line end vias using a line cut mask spacer without the risk of electrical shortage. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 10 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a hardmask layer over a dielectric layer;
forming mandrels over the hardmask layer;
forming first spacers on sides of the mandrels;
forming trenches by removing the mandrels and etching through the hardmask layer down into the dielectric layer;
removing the first spacers;
filling the trenches with a sacrificial layer;
forming and etching a block mask over the hardmask and sacrificial layers to form a cut area over a portion of the trenches;
forming second spacers at sides of the cut area;
removing the sacrificial layer from the portion of the trenches;
forming a mask in the cut area and the portion of trenches, the mask selected from a high density plasma (HDP) oxide, silicon carbide (SiC) or silicon carbon nitride (SiCNH);
selectively etching the second spacers; and
selectively etching the sacrificial layer and the dielectric layer to form self-aligned vias (SAVs).

2. The method according to claim 1, further comprising:
after removing the first spacers, forming a nitride liner in the trenches.

3. The method according to claim 1, further comprising:
filling the SAVs with a sacrificial material, the sacrificial material comprising optical dispersive layer (ODL).

4. The method according to claim 3, further comprising:
planarizing the sacrificial material down to the dielectric layer to expose an upper surface of the mask in the portion of the trenches.

5. The method according to claim 4, further comprising:
selectively removing the sacrificial layer from the trenches and SAVs.

6. The method according to claim 5, further comprising:
forming a metal liner in the trenches and SAVs;
forming metal over the metal liner to fill the trenches and SAVs; and
planarizing the metal liner and metal down to the upper surface of the mask and the dielectric layer.

7. The method according to claim 1, comprising:
forming the hardmask layer comprising titanium nitride (TiN) over the dielectric layer, wherein the dielectric layer comprises an ultra low-k (ULK) dielectric.

8. The method according to claim 6, comprising:
forming the mandrels comprising an ODL over the hardmask layer.

9. The method according to claim 8, comprising:
forming the first spacers comprising an oxide on the sides of the mandrels.

10. The method according to claim 9, comprising:
forming the second spacers comprising silicon nitride (SiN) at the sides of the cut area.

11. The method according to claim 1, comprising:
selectively etching the sacrificial layer and the dielectric layer by reactive ion etching (RIE) to form the SAVs.

12. A method comprising:
forming trenches in a dielectric layer;
filling the trenches with a sacrificial layer;
forming and etching a block mask over sacrificial layers to form a cut area over a portion of the trenches;
forming spacers at sides of the cut area;
removing the sacrificial layer from the portion of the trenches;
forming a mask in the cut area and the portion of trenches, the mask selected from a high density plasma (HDP) oxide, silicon carbide (SiC) or silicon carbon nitride (SiCNH);
selectively etching the spacers; and
selectively etching the sacrificial layer and the dielectric layer by reactive ion etching (RIE) to form self-aligned vias (SAVs).

13. The method according to claim 12, further comprising:
filling the SAVs with a sacrificial material, the sacrificial material comprising optical dispersive layer (ODL).

14. The method according to claim 13, further comprising:
planarizing the sacrificial material down to the dielectric layer to expose an upper surface of the mask in the portion of the trenches.

15. The method according to claim 14, further comprising:
selectively removing the sacrificial layer from the trenches and SAVs.

16. The method according to claim 15, further comprising:
forming a metal liner in the trenches and SAVs;
forming metal over the metal liner to fill the trenches and SAVs; and
planarizing the metal liner and metal down to the upper surface of the mask and the dielectric layer.

17. The method according to claim 12, comprising:
forming the hardmask layer comprising titanium nitride (TiN) over the dielectric layer, wherein the dielectric layer comprises an ultra low-k (ULK) dielectric; and
forming the spacers comprising silicon nitride (SiN) at the sides of the cut area.

* * * * *